United States Patent [19]

DeLuca et al.

[11] Patent Number: 4,701,352

[45] Date of Patent: Oct. 20, 1987

[54] SURFACE PREPARATION OF CERAMIC SUBSTRATES FOR METALLIZATION

[75] Inventors: Michael A. DeLuca, Holbrook; John F. McCormack, Roslyn Heights, both of N.Y.

[73] Assignee: Kollmorgen Corporation, Simsbury, Conn.

[21] Appl. No.: 679,835

[22] Filed: Dec. 10, 1984

Related U.S. Application Data

[63] Continuation-in-part of Ser. No. 607,874, May 10, 1984, Pat. No. 4,604,299, and Ser. No. 611,193, May 21, 1984, Pat. No. 4,574,094, which is a continuation-in-part of Ser. No. 502,748, Jun. 9, 1983, abandoned.

[51] Int. Cl.⁴ ............................................. B05D 5/12
[52] U.S. Cl. ..................................... 427/98; 427/190; 427/304; 427/305; 427/309; 427/404
[58] Field of Search ................... 427/190, 205, 96, 97, 427/98, 309, 304, 305, 331, 343, 404, 443.1; 428/457, 699, 702, 701; 156/663

[56] References Cited

U.S. PATENT DOCUMENTS

| | | | |
|---|---|---|---|
| 3,281,294 | 10/1966 | Martin | 156/663 |
| 3,281,309 | 10/1966 | Ross | 427/190 |
| 3,296,012 | 1/1967 | Stalnecker | 427/309 |
| 3,403,043 | 9/1968 | Thompson | 427/190 |
| 3,628,999 | 12/1971 | Schneble et al. | 427/98 |
| 3,671,291 | 6/1972 | Miller et al. | 427/305 |
| 3,672,986 | 6/1972 | Schneble et al. | 427/98 |
| 3,690,921 | 9/1972 | Elmore | 427/305 |
| 3,772,056 | 11/1973 | Polichette et al. | 427/404 |
| 3,772,078 | 11/1973 | Polichette et al. | 427/404 |
| 3,925,578 | 12/1975 | Polichette et al. | 427/305 |
| 3,930,963 | 1/1976 | Polichette et al. | 427/97 |
| 3,959,547 | 5/1976 | Polichette et al. | 427/404 |
| 3,993,802 | 11/1976 | Polichette et al. | 427/96 |
| 3,994,727 | 11/1976 | Polichette et al. | 427/96 |
| 4,046,620 | 9/1977 | Andrascek et al. | 427/309 |
| 4,189,827 | 2/1980 | Eberhart et al. | 427/190 |
| 4,206,254 | 6/1980 | Schmeckenbecher | 427/98 |
| 4,428,986 | 1/1984 | Schachameyer | 427/309 |

FOREIGN PATENT DOCUMENTS 51-47536  4/1976  Japan ..................................... 427/98

OTHER PUBLICATIONS

Ameen et al, J. Electrochem. Soc., 120, pp. 1518–1522, Nov. 1973.

Baudrand, Plating & Surface Finishing, pp. 72–75, Oct. 1984.

Jorgensen et al, "Copper Plating Process for Metallizing Alumina", Sep. 1984, pp. 347–352.

Delaney, "Copper Plated Ceramic Hybrids", pp. 394–398.

Primary Examiner—Sadie L. Childs
Attorney, Agent, or Firm—Morgan & Finnegan

[57] ABSTRACT

A process for preparing a ceramic substrate for metallization wherein a surface of the ceramic substrate is contacted with a composition containing one or more alkali metal compounds, preferably in the form of solid pellets. The pellets are melted on the ceramic surface. As the pellets melt, advancing waves of the molten composition spread across and wet the ceramic surface. The molten alkali metal composition is kept in contact with the ceramic surface for a time period sufficient to etch the surface and thus prepare it for adherent deposition of metal. The moving waves of melting composition supply fresh alkali metal compounds at the ceramic surface. After adhesion promotion, the ceramic surface is treated with compounds that promote adsorption of catalyst for metal deposition before being plated with metal. Uniform surface coverage with catalyst and metal and an improved adherent bond of metal to the ceramic surface are obtained. Furthermore, an article comprised of metal directly and adherently bonded onto a ceramic substrate is provided, the bond strength exceeding about 25 MPa.

19 Claims, No Drawings

SURFACE PREPARATION OF CERAMIC SUBSTRATES FOR METALLIZATION

CROSS REFERENCE TO RELATED APPLICATIONS

This application is a continuation-in-part of our U.S. application Ser. No. 607,874, U.S. Pat. No. 4,604,299 and Ser. No. 611,193, U.S. Pat. No. 4,574,094, filed May 10, 1984, and May 21, 1984, respectively, which in turn are continuations-in-part of U.S. application Ser. No. 502,748, filed June 9, 1983, now abandoned.

BACKGROUND OF THE INVENTION

1. Field of the Invention

This invention relates to the surface treatment of ceramic articles for metallization and to a metal layer or a metallized conductor pattern directly and adherently bonded onto a surface of a ceramic substrate, and an improved process for producing the same. More particularly, this invention relates to a printed circuit pattern directly and adherently bonded onto a surface of a ceramic substrate, and an improved process for producing the same.

2. Description of the Prior Art

Metallized conductor patterns or uniform metal layers on ceramic substrates have been widely used in the electronic industry. For many years, ceramics have been metallized by high cost processes such as the ones using fused metal-glass pastes or by thin film vacuum deposition techniques. Attempts to reproducibly make circuit patterns by direct electroless deposition have not been successful due to poor adhesion of the metal films to the substrate and non-reproducible and non-uniform surface coverage.

Printed circuits on ceramics including alumina were described as early as 1947. See "Printed Circuit Techniques", National Bureau of Standards, Circular 468 (1947) and National Bureau of Standards, Misc. Pub. 192 (1948). One type, known as a thin film circuit, consists of a thin film of metal deposited on a ceramic substrate by one of the vacuum plating techniques. In these techniques, a chromium or molybdenum film, having a thickness of about 0.02 microns, acts as a bonding agent for copper or gold conductors. Photolithography is used to produce high resolution patterns etched from the thin metal film. Such conductive patterns may be electroplated, up to 7 microns thick. Due to their high cost, thin film circuits have been limited to specialized applications such as high frequency applications and military applications where a high pattern resolution is vital.

Another type of printed circuit, known as a thick film circuit, consists of circuit conductors composed of a metal and glass film fired on a ceramic substrate. Typically, the film has a thickness of about 15 microns. Thick film circuits have been widely used; they are produced by screen printing in a circuit pattern with a paste containing a conductive metal powder and a glass frit in an organic carrier. After printing, the ceramic parts are fired in a furnace to burn off the carrier, sinter the conductive metal particles and fuse the glass, thereby forming glass-metal particle conductors. The conductors are firmly bonded to the ceramic by the glass. Components may be attached to such conductors by soldering, wire bonding and the like.

Conductors in thick film circuits have only 30-60 percent of the conductivity of the respective pure metal. However, high conductivity of pure metal is needed to provide interconnections for high speed logic circuits. Because conductors in thick film circuits do not have such high conductivity, they do not provide optimum interconnections for high speed logic circuits.

The minimum conductor width and the minimum space between conductors which can be obtained by screen printing and firing under special high quality procedures is 125 and 200 microns, respectively. However, under normal production conditions, these minima are 200 and 250 microns, respectively.

In the thick film multilayer process, a first layer of metal powder and glass frit is printed on a ceramic substrate and fired, typically at 850° C., in a furnace. Then, an insulating dielectric layer is screened over the conductor pattern, leaving exposed only the points at which contact is made to the next layer of metallization. This dielectric pattern also is fired at 850° C. Then, a second dielectric layer is printed and fired. Two layers of dielectric must be printed and fired to ensure that there are no pinholes. After the two layers of dielectric have been printed and fired, the next conductor layer is printed and fired making contact to the lower conductor layer as necessary through the openings left in the dielectric layers.

Typical multilayer ceramic packages contain two to six layers of metallization. Eight layers are not uncommon. For two layers of metallization, the substrate will be printed four times and fired at 850° C. seven times, and for four layer, thick film, multilayer ceramic, ten times. By the processes of the present invention, the same connectivity as a three or four layer, thick film, multilayer ceramic can be achieved by a two-sided, plated through hole, conductor pattern.

Attempts have been made to directly bond pure metal conductors to ceramic substrates including alumina in order to achieve high conductivity for ceramic based circuit patterns. See U.S. Pat. Nos. 3,744,120, to Burgess et al. and 3,766,634 to Babcock et al. Solid State Technology 18/5, 42 (1975) and U.S. Pat. No. 3,994,430, to Cusano et al. describe a process for bonding copper sheets to alumina by heating the copper in air to form an oxide film on its surface. The rreated copper sheet is bonded by the agency of this film to alumina at a temperature between 1065° C. and 1075° C. in a nitrogen furnace. In order to obtain well adhered copper foil without blisters: (1) the copper foil must be carefully oxidized to provide a black surface; (2) the copper oxide thickness must be carefully controlled; (3) the amount of oxygen in the copper foil must be controlled; (4) the oxygen content of the nitrogen furnace must be maintained at a controlled level to maintain a very moderately oxidizing atmosphere; and (5) the temperature must be controlled within one percent. This carefully controlled high temperature operation is difficult and expensive to tool for, to operate and to control. If the aforementioned extremely stringent controls are not maintained, blisters and other adhesion failures between the copper foil and the substrate are apparent. In spite of the difficult operating conditions, the process of Cusano et al. is being introduced into commercial application because of the need for the metallized product.

Although the above described systems are commercially used, the need for direct, simple metallization of ceramics with a layer or pattern of a pure metal conductor, such as copper, has prompted a continuous series of patents and proposed processes. See for example Apfelbach et al., Deutsches Patentschrift (DPS) No. 2,004,133; Jostan, DPS No. 2,453,192 and DPS No. 2,453,277; and Steiner DPS No. 2,533,524.

Other processes for producing printed circuit patterns on ceramic substrates are disclosed in U.S. Pat. Nos. 3,772,056; 3,772,078; 3,907,621; 3,925,578; 3,930,963; 3,959,547; 3,993,802 and 3,994,727. However, there is no teaching in all these patents of how to adhesion promote ceramic surfaces.

See also U.S. Pat. No. 3,296,012 to Stalnecker which discloses a process for producing a microporous surface for electrolessly plating alumina. Attempts to simply apply electroless metallization directly to ceramic substrates, have continually been tried and never been commercially successful. Toxic and corrosive materials such as hydrogen fluoride were tried to allow the direct bonding of electroless by formed metal deposit to ceramics without the use of firing temperatures. See, e.g., Ameen et al., *J. Electrochem. Soc.*, 120, 1518 (1973). However, the hydrofluoric etch gave poor bond strength due to the resulting surface topography.

U.S. Pat. No. 4,428,986 to Schachameyer discloses a process for direct autocatalytic plating of a metal film on beryllia. The process comprises uniformly roughening the surface by immersing the beryllia in a 50% sodium hydroxide solution at 250° C. for 7 to 20 minutes, rinsing with water, etching the beryllia with fluoboric acid for 5 to 20 minutes to attack the glass alloying constituents, rinsing with water, immersing the beryllia in a solution of 5 g/l stannous chloride and 3N hydrochloric acid, rinsing with water, followed by treating with 0.1 g/l palladium chloride solution, rinsing with water, and then electrolessly plating nickel on the beryllia. However, the etching step removes the silica and magnesium from the grain boundaries of the beryllia, thereby weakening the beryllia surface. As a result, the process of Schachameyer was able to achieve only 250 psi (1.7 MPa) bond strength before the beryllia substrate broke. This bond strength is only about a third of the bond strength normal in thick film type circuits and for many purposes not adequate.

U.S Pat. No. 3,690,921 to Elmore discloses the application of a concentrated sodium hydroxide solution to the surface of a ceramic substrate. The ceramic substrate is heated to drive off the solvent (water) and is heated further to melt the sodium hydroxide and etch the ceramic surface. The molten sodium hydroxide has a tendency to coalesce on, and not uniformly wet, the ceramic surface. Smooth ceramic surfaces, e.g , having a surface roughness below 0.13 micrometers (5 microinches) are difficult to completely wet with molten sodium hydroxide. As a result, uneven etching of ceramic surfaces, particularly smooth ceramic surfaces, results with the use of molten sodium hydroxide. In the best cases, when a metal is subsequently bonded to the ceramic surface, the bond strength is uneven across the ceramic surface. In the worst case, there is no adhesion of metal in some areas of the ceramic surface, or even no metal deposit because there was no adhesion of the electroless plating catalyst.

Elmore also describes an alternate embodiment wherein the ceramic substrate is directly immersed in a container of alkali metal hydroxide for 10-15 minutes at a temperature of 450° C. to 500° C. to etch the ceramic surface. Operation of the immersion procedure is difficult because: (1) the immersion of a ceramic article into a container of molten sodium hydroxide may crack the article due to thermal shock, thus resulting in low yields of useful product; and (2) a thick crust of carbonate forms on the surface of the molten sodium hydroxide impeding the manufacturing process. The processes described by Elmore did not achieve commercial production.

All of the aforementioned processes for depositing metals on ceramic surfaces which include an etching step using alkali metal compounds in a molten state do not guarantee uniform adhesion promotion of the ceramic substrate.

The trend in ceramic printed circuit manufacturing is toward smoother and more uniform surface topography. A smooth surface provides better conductor definition and improved parameters for propogation of very high frequency signals at the substrate-conductor interface.

Unfortunately, the smoother the ceramic surface, the lower the net surface energy. As a result, the alkali metal compound does not completely wet such smooth ceramic surfaces having surface roughnesses of, e.g. 0.6 micrometers. During the fusion step, the liquid caustic tends to coalesce into one or more areas on the surface of the substrate to achieve lower net surface energy. This results in a less than uniform surface etch and thus defective surface texture.

Total immersion of an alumina substrate in molten sodium hydroxides gives a uniform but severe surface etch. The severe surface etch results in a rough surface which does not permit fine conductor line resolution. In addition, such total immersion also tends to weaken the intrinsic structural integrity of the ceramic substrate resulting in cracks, especially in ceramic substrates provided with drilled holes.

As the purity of the ceramic increases, the surface also becomes smoother. Attempts to etch, for example, 99.5% pure electronic grade alumina by the procedures described in the Elmore U.S. Pat. No. 3,690,921, tend to result in a surface that is highly non-uniform.

Since 99.5% electronic grade alumina is normally used for microwave circuitry, surface roughness caused by deep etching must be avoided in order not to disturb the microwave signal propagation. 89 to 96% pure electronic grade alumina shows less of this problem, although it frequently is difficult to achieve satisfactory results on a manufacturing scale. However, it has not been possible to obtain a uniform, adherent metallization of smooth 99.5% alumina substrates by the procedures disclosed in Elmore U.S. Pat. No. 3,690,921.

Non-uniform etching causes non-uniform adhesion of metal deposits, e.g., conductor-to-substrate and even areas of no adhesion or no conductor. It would be advantageous to be able to wet the ceramic more uniformly with an alkali metal compound, such as NaOH, and to be able to maintain uniform liquid-to-solid contact throughout the fusion process. This would result in a more consistent etching of ceramics and uniform adhesion of metal deposits formed on the surface of such ceramic substrates.

Quaternary amine surfactants and detergent blends containing cationic wetting agents have been used for about 20 years to prepare plastic substrates for reception of palladium catalysts for electroless plating. Illustrative compositions containing these surfactants are disclosed in U.S. Pat. Nos. 3,627,558 to Roger et al., 3,684,572 to Taylor and 3,899,617 to Courduvelis. However, heretofore these surfactants have not been suggested for preparing ceramic substrates for reception of palladium catalysts for electroless plating. Moreover, commercially available, alkaline cleaner-conditioners which are used to prepare plastic substrates for reception of palladium catalysts for electroless plating have not been found to be effective in preparing ceramic substrates for reception of palladium catalysts for electroless plating.

SUMMARY OF THE INVENTION

1. Objects of the Invention

An object of the present invention is to provide a process for applying a metal film on a ceramic substrate and obtain excellent surface coverage and a bond strength of at least 3 MPa, preferably at least 5 MPa more preferably at least 25 MPa.

Another object of the invention is to provide an improved process for adhesion promoting surfaces of ceramic substrates containing >89% alumina for adherent metallization.

A further object of the invention is to produce a metal plated ceramic substrate which may be used for fine line circuit applications with highly pure metal conductors.

Still another object of the invention is to provide a reliable process for metallizing the surfaces of 98 to 99.5% alumina substrates without creating a rough, deep etched surface.

It is also an object of the invention to provide an electrolessly deposited, direct bonded conductor or conductor pattern having excellent adhesion to a ceramic substrate and a process for producing the metal coated ceramic substrate.

An object of the invention is to provide a ceramic substrate with securely attached metal conductors forming an interconnection network suitable for high speed logic circuits and a process for producing plated substrates suitable for the manufacture of, or for the manufacturing of, said interconnection networks.

An object of the invention is to provide a two-sided metal plated ceramic substrate with a through hole conductor pattern and a conductor density comparable to a three or four layer, thick film, multilayer ceramic.

Additional objects and advantages of the invention will be set forth in part in the description, or may be realized by practice of the invention, the objects and advantages being realized and attained by means of the methods, processes, instrumentalities and combinations particularly pointed out in the appended claims.

2. Brief Description of the Invention

It has been discovered that bond strengths greater than 25 MPa between metal and a ceramic surface are consistently produced by adhesion promoting the ceramic surface and depositing metal on the adhesion promoted surface, according to the processes of this invention.

The present invention is directed to a process for producing metal films or deposits on ceramic substrates including alumina, which have excellent surface coverage and bond strength (i.e., at least 3 MPa, preferably at least 5 MPa more preferably at least 25 MPa) as measured by the "dot pull test" described herein below. The present invention also includes ceramic substrates having printed circuit patterns formed from such films or deposits. The process of this invention may be used to treat ceramic substrates for electroless or electrolytic metal deposition. With the process of this invention, metal deposits on the ceramic substrate may be obtained having a thickness of at least 0.2 microns, preferably at least 2 microns, and printed circuit pattern conductor features with a width as low as 50 microns, and even as low as 25 microns.

The process of this invention comprises the steps of: (a) treating or adhesion promoting the surface of the ceramic with an alkali metal composition containing at least one alkali metal compound in the form of solid pellets or other solid masses having discrete shapes, the composition becoming molten in situ on the ceramic surface, and spreading out and wetting the ceramic surface; (b) contacting the adhesion promoted surface with a solution capable of promoting adsorption of catalyst on the treated surface; (c) sensitizing or catalyzing the treated surface for plating; and (d) depositing metal on the ceramic surface.

3. Detailed Description Of The Invention

In one aspect, this invention concerns an improvement in a process for metallizing a surface of a ceramic substrate which includes adhesion promoting the surface with an alkali metal composition containing one or more alkali metal compounds and subsequently depositing metal on the adhesion promoted surface. The improvement comprises providing the alkali metal compound(s) in the form of one or more discrete solid shapes, each having a preselected mass; contacting a preselected portion or preselected portions of the ceramic surface with a quantity of the solid shapes which when molten will spread across and uniformly wet the ceramic surface; and heating the alkali metal composition in situ on the ceramic surface, for a time period and at or above a temperature at which the alkali metal composition becomes molten, spreading out and uniformly wetting the ceramic surface, and which is sufficient to adhesion promote the ceramic surface, and render it receptive to subsequent adherent metal deposition. In a later step, an adherent metal layer is formed on the treated ceramic surface or selected parts thereof.

In another aspect, this invention concerns a process for metallizing a surface of a ceramic substrate which includes adhesion promoting the surface with an alkali metal composition containing one or more alkali metal compounds and subsequently depositing metal on the adhesion promoted surface. The improvement comprises providing the alkali metal compound(s) in the form of a multiplicity of discrete solid pellets. Each pellet should have a mass between 150 mg and 200 mg. Preselected portions of the ceramic surface are contacted with a quantity of the alkali metal composition which when molten will spread across and uniformly wet the ceramic surface. The alkali metal composition and the substrate are heated for a time period between 5 and 20 minutes at a temperature between about 450° C. and about 700° C. to melt the pellets in situ on the ceramic surface. The melting pellets spread out and uniformly wet the ceramic surface. The time and temperature achieved by heating being sufficient to adhesion promote the ceramic surface and render it receptive to subsequent adherent metal deposition. In a later step, an adherent metal layer may be formed on the treated ceramic surface or selected parts thereof.

In another aspect, this invention concerns a process for producing a printed circuit on a surface of a ceramic substrate comprising:

(a) contacting the ceramic surface with an alkali metal composition comprised of an alkali metal compound in the form of a multiplicity of discrete solid shapes, each shape having a preselected mass, said shapes being present in a quantity which when molten will spread across and uniformly wet the ceramic surface;

(b) heating the alkali metal composition and the substrate for a time period and at or above a temperature at which the alkali metal composition becomes molten in situ on the ceramic surface, spreading out and uniformly wetting the ceramic surface, and which is sufficient to adhesion promote the ceramic surface and render it receptive to subsequent adherent metal deposition;

(c) treating the ceramic surface to activate it for electroless metal deposition;

(d) depositing metal onto the activated surface;

(e) removing portions of the deposited metal to produce a metal printed circuit conductor pattern adhering to the surface of the ceramic substrate.

In another aspect, this invention concerns a process for producing a metallized conductor pattern on a surface of a ceramic substrate having a surface roughness less than about 0.7 micrometers, the process comprising: contacting the surface with an alkali metal composition comprised of one or more alkali metal compounds in the form of a multiplicity of discrete solid shapes, each shape having a preselected mass, said shapes being present in a quantity which when molten will spread across and uniformly wet the ceramic surface; heating the alkali metal composition and the substrate for a time period and at or above a temperature at which the alkali metal composition becomes molten in situ on the ceramic surface, spreading out and uniformly wetting the ceramic surface, and which is sufficient to adhesion promote the ceramic surface and render it receptive to subsequent adherent metal deposition; rinsing the surface with an aqueous solution; neutralizing the ceramic surface with an acid; repeating the rinsing step; contacting the ceramic surface with an activator solution providing stannous tin ions and precious metal ions, to activate the surface for electroless metal deposition; and contacting the activated surface or selected parts thereof with a metal depositing solution for a time period sufficient to form a metal layer thereon.

According to the process of this invention, the ceramic surface is adhesion promoted by contact with an alkali metal composition in the form of discrete solid shapes. The solid shapes are melted in situ on the ceramic surface at a temperature and for a time period sufficient to adhesion promote the ceramic surface. Adhesion promotion is a chemical modification of the ceramic surface which renders it receptive for a uniform, well-bonded metallic overplate. After the ceramic substrate has been adhesion promoted, it is cooled and residual alkali metal composition on the ceramic surface is removed, e.g., by washing. The ceramic surface then may be metallized by conventional techniques.

In one metallization technique, the adhesion promoted ceramic surface which has been cooled to room temperature and washed in water, is neutralized in an acid and again rinsed in water. The surface is then sensitized or catalyzed for plating by conventional methods.

Any metal film may be deposited on the surface of a ceramic substrate in accordance with the present invention. Typically, copper, nickel, silver, gold, tin or cobalt films or deposits are electrolessly deposited.

Ceramic substrates suitable for use according to the present invention include aluminas, beryllias, carbides such as silicon carbide and silicon carbide/beryllia, titanates, such as barium titanate, and nitrides such as silicon nitride. Beryllium nitride is believed to be a suitable ceramic substrate. Other ceramic substrates which are believed to be suitable for use according to the present invention include silicates, forsterite, mullite, steatite, porcelains, and mixtures of the foregoing such as cordorite, which is a magnesia, alumina, silica mixture. Preferred ceramic substrates include 94 to 99.5% aluminas and silicon nitrides. The process of this invention is preferred for aluminas having a surface roughness between about 0.05 and 0.7 micrometers.

Preferably, the ceramic substrates are washed or degreased in a hot alkaline cleaner to remove any dirt, debris, grease, fingerprints, etc.

The surface of the ceramic substrate is adhesion promoted with an alkali metal composition in the form of one or more discrete solid shapes.

Many alkali metal compounds are suitable for adhesion promotion of ceramics. It is preferred to use compounds with lower melting points.

The solid discrete shapes may include a flow enhancing agent. For examples, the solid pellets may be formed by admixing less than 50% by weight, preferably less than 20% of flow enhancing solid materials or even liquids with the alkali metal compounds and then shaping the composition into a pellet by conventional means.

Many materials are useful for both flow enhancing and depressing the melting point. Examples of melting point depressants which are believed to to be within the scope of this invention include stannous chloride, nitric acid, water, sodium and potassium formate, potassium acetate, Rochelle salts, borax, and the hydrates of lithium bromide, iodide, and phosphate, and potassium pyrophosphate. Sometimes, it may be preferable to avoid the hydroxides for safety reasons and for ease of neutralization. Typical alkali metal compounds suitable for use in this invention and their melting points as reported in *Lange's Handbook of Chemistry*, Eleventh Edition (1972) are as follows:

| Alkali Metal | Melting Points °C. | | |
|---|---|---|---|
| | Anion | | |
| | Hydroxide | Nitrate | Carbonate |
| Lithium | 445 | 261 | 618 |
| Sodium | 328 | 308 | 851 |
| Potassium | 360 | 334 | 891 |
| Rubidium | 300 | 310 | 837 |
| Cesium | 272 | 414 | — |

Eutectic mixtures such as a mixture of potassium hydroxide and sodium hydroxide or a mixture of sodium carbonate and potassium nitrate also may be used to etch the substrate. The former type of mixture preferably has a percent by weight ratio of 59:41 of KOH to NaOH with a melting point of 170° C.

The alkali metal compositions used as etchants should be heated to a temperature above their melting point. Depending upon the amount of melting point depressant(s) present, the etchant composition is heated to a temperature above about 150° C., preferably above about 300° C., and more preferably between about 450° C. and about 700° C.

Preferred alkali metal compounds for the etchant composition include sodium hydroxide, potassium hydroxide, and sodium carbonate and potassium nitrate.

The discrete solid shapes should be dimensioned to remain in situ when placed on the ceramic substrate.

Suitable shapes incude pellets (hemispheres), flakes, pyramids, rods, cones, discs, bars and the like.

The shapes may be sized from about 25 mg to about 500 mg, preferably from about 150 mg to about 200 mg. If the ceramic surface to be adhesion promoted is small, e.g. 25 mm×.25 mm, a smaller sized alkali metal compound shape should be selected, e.g. about 50 mg. Larger sized shapes will tend to overetch the small surface area directly below where the shape is placed. By using smaller sized shapes for small surface areas, this effect is minimized. In general, the smaller the shape, the shorter the distance the shape will propagate on the ceramic surface, hence etching a smaller area. Numerous small shapes, however, tend to leave gaps of unwetted surface, and are therefore undesirable for larger surface areas. Thus, when powdered sodium hydroxide is applied uniformly to a ceramic surface, the surface is etched in a reticulated pattern leaving discrete areas poorly etched.

The number of shapes placed on the ceramic surface depends on the total surface area to be wetted and adhesion promoted. Thus a 10 mm by 10 mm alumina substrate would require between 6 to 12 shapes of average weight between 150 mg and 200 mg; and a 50 mm by 50 mm substrate would require between 4 and 8 shapes.

The shapes preferably are uniformly distributed on the ceramic surface, for example, substantially symmetrical with respect to the center of the ceramic surface area to be etched. Preferably, the shapes are placed along the outer edges of the ceramic surface to be etched. Since adhesion of the metal to the ceramic is lowest at points where the shapes were positioned, it is preferable to position the shapes on edges which will be discarded, or where metallization is removed in final processing. Alternately, the shapes can be positioned where maximum bond strength is not required.

The total weight of all the discrete shapes of the alkali metal composition distributed on the ceramic surface to be adhesion promoted is preferably between 0.1 and 0.4 mg of the alkali metal composition per square millimeter of ceramic surface to be adhesion promoted.

Ceramic surfaces can be adhesion promoted or suitably etched with molten alkali metal compositions at temperatures between about 150° C. and about 1200° C. Aluminas are preferably etched with molten alkali metal compositions at a temperature above about 450° C., more preferably above about 550° C., and at a temperature below about 700° C., preferably below about 650° C. At temperatures below 450° C., the etch of the alumina surface tends to be non-uniform with some pits. At temperatures of 700° C. and above, the etch of the alumina surface is uniform but undesirably deep and rough.

It is believed that silicon carbide-beryllium oxide should be etched with molten alkali metal compositions at the same temperatures used for aluminas.

Titanates should be etched with molten alkali metal compositions at a temperature above about 150° C., preferably above about 200° C., and below about 450° C., preferably below about 400° C. Titanates containing glasses which rapidly dissolve in molten alkali metal compositions or containing more than 10% glasses should be etched at temperatures between about 170° C. and about 250° C.

In order to adhesion promote ceramic substrates such as barium titanate, lower temperatures are preferred, i.e., in the range of 150° to 300° C. One alkali metal composition suitable for adhesion promoting ceramics at lower temperatures is sodium hydroxide with equimolar amounts water to depress the melting point and enhance the flow of molten alkali metal composition on the ceramic surface. An equimolar sodium hydroxide water composition, $NaOH.H_2O$ containing 31% water by weight has a melting point of 63.3° C. Thus a 100 mg. pellet of $NaOH.H_2O$ would be positioned on each end of a 25 mm by 100 mm piece of barium titanate to adhesion promote the ends for forming metallic electrodes at each end. The barium titanate piece and the pellets would be heated to 250° C. to melt the pellets and adhesion promote the ends of the barium titanate. After subsequent metallization, the electrode area may be further defined by photolithographic techniques.

Silicon nitride should be etched with molten alkali metal compositions at a temperature above about 250° C. and below about 350° C., preferably about 300° C.

Among the methods of heating the ceramic substrates to fuse the alkali metal composition are ovens, muffle furnaces and conveyorized muffle furnaces. The substrates coated with the discrete solid shapes of this invention may be placed in a oven or furnace on inert supports such as graphite. Since the portion of the substrate in contact with the inert support will frequently not be adequately adhesion promoted or etched, the point of contact between the substrates and the support should preferably be a position on the substrate that does not require adherent metallization.

The ceramic surface should be adhesion promoted for a time period sufficient to increase its available surface area and render it receptive to adherent metallization. The preferred time for etching aluminas and beryllias with the alkali metal compositions which become molten in situ on the ceramic surfaces is between 5 minutes and 20 minutes, preferably between 7 and 10 minutes. For ceramic substrates with lower melting points (less refractory), such as titanates, mullite, fosterite, steatites and porcelains, the preferred time for etching with the molten alkali metal compositions is less than 5 minutes.

Typical of the metal deposition solutions used are electroless plating solutions such as nickel, cobalt, gold, tin and copper. See U.S. Pat. Nos. 3,485,643; 3,607,317; 3,589,916; 4,269,625; and the like. Electrolytic deposition solutions also may be used in the practice of this invention.

The use of unitary catalyst solutions prepared from both stannous chloride and palladium chloride is well known in the printed circuit and plating-on-plastic arts. Typical catalyst solutions are in U.S. Pat. No. 4,187,198 to Zeblisky and U.S. Pat. No. 3,961,109 to Kremer et al. Such catalyst solutions may be advantageously used in plating on ceramics over the two step sensitizing and seeding solutions as described by Elmore.

Adsorption of the species rendering the surface receptive to metal deposition, i.e., sensitizer, activator or catalysts, and eventually surface coverage of the metal deposit is greatly enhanced by treatment of the etched ceramic surface with a compound that is adsorbed on such ceramic surface, promotes adsorption of the sensitizing species over the whole surface, and provides complete coverage. Among the compounds that can be adsorbed and promote adsorption of the sensitizer are simple chlorides, bromides and iodides, and complexes of chloride bromides and iodides. Acidic chloride, bromide and iodide solutions greater than 0.5 in the halide may be used to promote uniform adsorption on ceramic surfaces. These acidic halide solutions do not attack the glassy phase of the ceramic substrate.

The acidic chloride, bromide or iodide solution can be used as a pretreatment or predip solution for the ceramic substrate after adhesion promotion, rinsing, neutralizing and rinsing again; and before treating with, e.g., stannous chloride sensitizer. After such pretreatment, sensitizer is quickly adsorbed on the etched ceramic substrate. Immersion in the sensitizing solution need not be unduly prolonged. In addition, the tin species is so securely adsorbed that it is not inadvertently removed in a conventional rinsing step.

The acidic chloride, bromide or iodide predip or pretreatment solution preferably is greater than 2 molar in halide ion, and more preferably is greater than 3 molar in halide ion. The acidity of the halide solution preferably is greater than 0.001 molar in hydrogen ion, more preferably is greater than 0.01 molar in hydrogen ion, and most preferably between 0.1 and 12 molar in hydrogen ion.

Alternatively, applicants have found that the chloride, bromide, or iodide concentration of the sensitizer solution may be increased to accomplish the same desired effect, i.e., more strongly adsorbed sensitizer on the ceramic substrate. High acidity inhibits adsorption of tin sensitizers. The ratio of the halide to acid in a stannous ion sensitizer solution is preferably at least 15 to 1. It is possible to use halide to acid ratios as low as 2 to 1 but these are not preferred because higher tin concentrations, i.e., one molar tin are required.

Although we do not wish to be bound by theory, it is believed that in case of tin comprising solutions, the tin species which is adsorbed on the alumina is the tetrahalostannate (II) moiety. For example, high chloride ion concentration relative to acidity favors the formation of the tetrachlorostannate (II), while high acid concentration favor the formation of trichloro and dichloro stannate (II) complexes. See, for example, *Stability Constants of Metal Ion complexes,* Spec. Pub. 17, Sillen and Martell, The Chemical Society, London (1961), pp. 296–7.

When using a unitary catalyst solution comprising a chloride, bromide or iodide of palladium, tin and the halide acid or alkali metal halide salt without an acidic halide predip solution, the halide concentration may be varied over a range from 0.5 to 6 moles per liter, preferably greater than 1.5 moles per liter and preferably less than 4 moles per liter. The acidity may be varied from 0.03 to 6 moles per liter, preferably greater than 0.3 moles per liter and preferably less than 4 moles per liter.

For greater processing latitude and to minimize processing errors, the acidic halide pretreatments may be combined with a sensitizer solution formulated with the halide and acid concentrations described herein.

Furthermore, the acidic halide predip also may be used with a unitary catalyst solution.

By using an acidic halide predip, other catalytic precious or semiprecious metals may be adsorbed onto the ceramic surface amongst which are the Group IA metals, silver and gold and the other Group VIII precious metals.

Also among the compounds that can be adsorbed and promote adsorption of the sensitizer are certain nitrogen-containing compounds. These adsorption promoters may be selected from the group consisting of quaternary compounds, amine oxides, alkanolamines, amides, betaines, amino acids and guanidine derivatives.

Suitable quaternary compounds are believed to include complex quaternary surfactants (Varex 68 TM, commercially available from Sherex Chemical Company Inc., Dublin, Ohio 43017), quaternary ammonium compounds such as quaternary ammonium chlorides (commercially available as Emulsifier Four TM and Emulsifer Five TM from Tomah Products Inc., Milton, Wisc. 53563), polyethoxylated oleyl and stearic quaternary ammonium chlorides (commercially available as Ethoquad 0/12 TM and Ethoquad 18/12 TM from Armak Ind. Chem. Div., Chicago, Ill. 60690); polypropoxylated quaternary ammonium chlorides (commercially available as Emcol CC-9 TM, Emcol CC-36 TM, Emcol CC-42 TM, Emcol CC-55 TM and Emcol CC-57 TM from United Chemical Corp., N.Y., N.Y. 10022), and quaternary pyridinium compounds such as cetyl pyridinium bromide.

A suitable amine oxide is believed to be myristylcetyldimethylamine oxide (commercially available as Ammonyx MCO TM from Onyx Chemical Company, Jersey City, N.J. 07302).

Suitable alkanolamines are ethanolamine and are believed to include block copolymers of ethylene oxide and propylene reacted with ethylenediamine (commercially available as Tetronic 1504 TM from BASF Wyandotte Corp., Parsippany, N.J. 07054).

Suitable amides are believed to include alkylolamides such as lauric ethoxylated amide (commercially available as Unamide L-5 TM from Lonza Inc., Fair Haven, N.J. 07410), and the coco ethoxylated amides (commercially available as Unamide C-5 TM from Lonza Inc., Fair Haven, N.J. 07410, and Ammidox C-5 TM from Stepan Chemical Company, Northfield, Ill. 60093).

A suitable amino acid and guanadine derivative is believed to be creatine.

Suitable betaines include tallow betaine surfactants, e.g., Mirataine TM (commercially available from Miranol Chemical Co. Inc., Dayton, N.J. 08810).

Combinations of adsorption promoters also are useful for promoting the adsorption of either stannous ion sensitizers or unitary noble metal catalyst solutions comprising both palladium and tin, or other catalyst combinations of noble metals and elements from Group IV of the Periodic Table.

Certain nitrogen-containing surfactants are suitable for this invention. Also, that the pH of the nitrogen-containing surfactant solutions should be acidic.

Non-noble metal catalysts for electroless metal deposition also may be used for carrying out this invention. Suitable non-noble metal catalysts include those described by Polichette et al. U.S. Pat. Nos. 3,772,056; 3,925,578; 3,993,802; and 3,907,621, the disclosures of which are incorporated herein by reference. It has been further discovered that the adsorption of these non-noble metal catalysts on the etched ceramic surface, and thus the eventual surface coverage of the metal deposit also is enhanced by treatment of the etched ceramic surface with a compound that promotes adsorption of the non-noble metal catalyst. Compounds that promote adsorption of a non-noble metal catalyst include nonionic surfactants such as the alkylphenoxypolyglycidols (e.g., nonylphenoxypolyglycidol commercially available as Olin 6G TM from Olin Chemical Corp., Stanford, Conn. 06904)).

While not wishing to be bound by theory, it is believed that adsorption of the strongly negatively charged catalytic species, such as stannous chloride or the unitary palladium chloride-tin chloride catalysts, is enhanced by cationic surface active agents and adsorption promoters containing positive nitrogen dipoles. On the other hand, the non-noble metal catalysts are frequently neutral or only mildly negative or mildly positive species, so that adsorption is enhanced by nonionic surfactants The adsorption promoter(s) may be used in an aqueous solution at concentrations above about 10 mg per liter, preferably above about 100 mg per liter, more preferably above about 1 gram per liter, and below about 50 grams per liter, preferably below about 10 grams per liter, and more preferably below about 6 grams per liter. There should be sufficient adsorption promoter to completely cover the ceramic surface with an adsorbed layer. If the concentration of the adsorption promoter is too low or the contact time with the adsorption promoter solution is too short, the ceramic surface will not be completely covered with an adsorbed layer. This condition is characterized by "skip plating" in subsequent metal deposition. The upper limit for the concentration is determined by practical economic considerations. Specifically, if too high a concentration of adsorption promoter is used, excessive rinsing is required to avoid buildup of adsorption promoter in the sensitizer and plating baths subsequently used which would result in blistering of a subsequent metal deposit of poorly adherent metal layers.

The pH of the adsorption promoter solution should be selected to give good adsorption on the substrate. For nitrogen-containing surfactants, an acidic pH is preferred; a more preferred pH is above 1 and below 5. Nonionic surfactants operate best as adsorption promoters at neutral pH, i.e., at a pH between 4 and 11.

The nitrogen-containing, adsorption promoters can be used as a pretreatment or predip for the ceramic substrate after adhesion promotion, rinsing, neutralizing and rinsing again; and before treating with, e.g., stannous chloride sensitizer. With such pretreatment, the sensitizer is quickly adsorbed on the etched ceramic substrate so that the immersion in sensitizing solution is not unduly prolonged. In addition, the adsorbed tin species is securely adsorbed so that it is not inadvertently removed in a conventional rinsing step.

Other precious metal catalyst solutions such as those described by Jung et al., U.S. Pat. No. 4,015,992 and Ehrich et al; U.S. Pat. No. 4,248,632 also may employed for carrying out this invention.

Other non-noble metal catalysts for electroless metal deposition believed to be useful for carrying out this invention are those described by Nuzzi U.S. Pat. No. 3,962,494 and Nuzzi et al. U.S. Pat. Nos. 4,199,623 and 4,259,113, the disclosures of which are incorporated herein by reference.

Suitable procedures for catalyzing for electrolessly depositing metal are described in U.S. Ser. No. 502,748, filed June 9, 1983, U.S. Ser. No. 607,874, filed May 10, 1984, and U.S. Ser. No. 611,193, filed May 21, 1984, all to M. DeLuca et al.

Numerous processes are employed in the manufacture of printed circuit boards. As will be understood by those skilled in the art, these printed circuit manufacturing processes may be used in conjunction with the adhesion promoting step of this invention and with the step of rendering the ceramic surface receptive to metallization in order to produce metallized ceramic printed circuit boards.

According to this invention, there are provided processes for applying adherent metal layer(s) to a ceramic surface which layer(s) can be used to join two or more metallized ceramic surfaces or to join metallized ceramic surfaces to metal articles by standard metal joining techniques such as soldering, brazing and welding. Furthermore, this invention provides processes for forming a hermetic seal of a metal layer to a ceramic substrate. This invention also provides a hermetically sealed ceramic package for microcircuits and other applications.

By "hermetic seal" as used throughout this specification, is meant one which passes the fine leak tests of MIL-STD-883B, Method 1014.3 (May 16, 1979), incorporated herein by reference.

As will be well understood by those skilled in the art, these hermetic seals are suitable for hybrid packages, chip carriers, integrated circuit packages, flat packs, dual-in-line packages and optoelectronic packages. In forming a hermetic seal to a ceramic substrate by the processes of this invention, a surface of the ceramic substrate is first provided with a metal layer, by the procedures described above. The metal layer on the ceramic surface then is joined to a metal or to another metallized ceramic substrate by standard metal joining techniques, typically soldering.

Other modes of operating this invention are, inter alia, disclosed in the examples.

EXAMPLE 1

Six hemispherical pellets of sodium hydroxide with an average weight of 170 mg each were placed in two rows of three pellets each row along opposing edges of a 75 mm×75 mm×0.63 mm of a 96% alumina sheet. The alumina sheet was placed on a conveyor which conveyed it through a muffle chamber maintained at 600° C. The time in the 600° C. zone was seven minutes. In the muffle chamber, the sodium hydroxide pellets melted, spread across and adhesion promoted the alumina surface. The sheet was washed in water, then in 35% sulfuric acid solution, rinsed and dried. Six more pellets were similarly placed on the opposite surface of the ceramic, and the ceramic once more passed through the muffle to melt the pellets and adhesion promote the opposite surface.

The remainder of the fusion products were removed by immersing the substrates in a 35% sulfuric acid solution for 2 minutes with slow agitation. This was followed by a rinse with water.

The parts were then metallized by the following proceedure:

(1) Immerse for 2 minutes in an aqueous conditioner solution containing an amphoteric surfactant (tallow betaine surfactant), a nonionic surfactant (nonylphenoxy polyethoxyethanol) and ethanolamine, the solution adjusted to pH 2.

(2) Rinse in water for 2 minutes.

(3) Place the parts in an aqueous halide predip solution of 3.8 moles sodium chloride, 0.1 moles hydrochloric acid, and 0.025 moles stannous chloride per liter.

(4) Immerse the substrate for 3 minutes at 40° C. in a palladium tin activator. The activator is prepared by diluting 31 milliliters of a concentrate prepared according to U.S. Pat. No. 3,961,109 to Kremer et al. diluted with 970 milliliters of the halide predip solution to achieve:

| | |
|---|---|
| Palladium ion | 75 mg/l |
| Stannous Chloride | 13.6 g/l |
| Sodium Chloride | 3.7 mol/l |
| Resorcinol | 0.75 g/l |

-continued

| | |
|---|---|
| HCl | 0.2 mol/l |

(5) Rinse for 2 minutes in water.
(6) Place the parts in an accelerator solution consisting of 3% fluoroboric acid in water.
(7) Immerse the substrates in an electroless copper bath at 30° C. to deposit 1.8 micrometers thickness of copper. The plating solution consists of:

| | |
|---|---|
| Ethylenediamine Tetra 2-Propanol | 20 g/l |
| Copper chloride | 6.1 g/l |
| Formaldehyde | 8 g/l |
| Sodium hydroxide | 15 g/l |
| Sodium cyanide | 0.01 g/l |
| 2,2-Dipyridyl | 0.03 g/l |
| Wetting agent (A block copolymer polyoxyethylene and polyoxypropylene commercially available as Pluronic P-85 TM from BASF Wyandotte Corp., Wyandotte, Michigan.) | 0.01 g/l |

After metallizing the ceramic substrates were electroplated in a copper electroplating bath to build up the copper thickness to 25 micrometers. The bond strength was measured using the dot-pull test. The substrates were imaged and etched by conventional photolithographic techniques to produce ten copper dots 2.5 mm in diameter. Wires were attached to the copper dots with solder and the bond strength was measured as the dots were pulled away from the ceramic surfaces. The strength of the bond between metal layer and the ceramic substrate measured by the dot pull test ranged between 26 and 50 MPa except at positions which were underneath the pellets where the bond strength was 13 MPa.

In most applications, the edges (including the positions which were underneath the pellets) are removed in the final fabrication.

EXAMPLE 2

Example 1 was repeated with six pellets of potassium hydroxide melted on an alumina substrate for 15 minutes at 600° C. The dot pull strength results were in the range of 3.5 to 12 MPa with an average bond strength of 5.9 MPa.

EXAMPLE 3

Five pellets of sodium hydroxide were placed in the corners and one in the center of a ceramic substrate 50 mm×50 mm×0.63 mm of 96% alumina. The substrate was placed in an oven at 450° C. for 10 minutes to adhesion promote the surface. After adhesion promotion, the ceramic surface was examined with a scanning electron microscope at 1000× magnification. The examination reveals the alumina grains of the surface are covered with etched pores with diameters of one micrometer and less.

In a comparison test, the parts were treated at 450° C. by immersion in molten sodium hydroxide for 10 minutes. The adhesion promoted surface was severely roughened with surface grains etched down to a small size, but without etched pores in the grains.

EXAMPLE 4

Example 1 was repeated except that the alumina sheet was adhesion promoted in an oven at 450° C. for 15 minutes. The bond strength of the metal layer to the ceramic measured by the dot pull test was between 25 MPa and 50 MPa.

What is claimed is:

1. In a process for metallizing a surface of a ceramic substrate which includes adhesion promoting the surface with an alkali metal composition containing one or more alkali metal compounds and subsequently depositing metal on the adhesion promoted surface, the improvement which comprises:

providing said alkali metal compound(s) in the form of one or more discrete solid shapes sized 25 mg to about 500 mg contacting the ceramic surface with a quantity of the solid shapes which when molten will spread across and uniformly wet the ceramic surface;

heating the alkali metal composition and the substrate for a time period and at or above a temperature at which the alkali metal composition becomes molten in situ on the ceramic surface, spreading out and uniformly wetting the ceramic surface and which is sufficient to adhesion promote the ceramic surface, and render it receptive to subsequent adherent metal deposition; and in a later step, plating an adherent metal layer on the treated ceramic surface or selected parts thereof.

2. The process of claim 1, further including, after adhesion promoting said ceramic surface and before forming said metal layer thereon, the step of exposing said surface to an acidic halide solution containing one or more halides selected from the group consisting of chloridies, bromides and iodides in an amount greater than 0.5 moles halide per liter and sufficient to promote adsorption of catalyst on the surface and eliminate bare spots in an adherent metal layer formed on the surface or selected parts thereof; and treating said surface with a catalyst solution for rendering said surface receptive to deposition of metal.

3. The process of claim 1, further including, after adhesion promoting said ceramic surface and before forming said metal layer thereon, the step of exposing said surface to an adsorption promoter selected from the group consisting of ethoxylated non-ionic compounds and nitrogen-containing compounds, said nitrogen-containing compounds being selected from the group consisting of quaternary compounds, amine oxides, alkanolamines, amides, betaines, amino acids and guanidine derivatives, in an amount sufficient to, and at a pH which will promote adsorption of catalyst on the surface and eliminate bare spots in an adherent metal layer formed on the surface or selected parts thereof; and treating said surface with a catalyst solution for rendering said surface receptive to deposition of metal.

4. The process of claim 1, wherein a multiplicity of said shapes are distributed on the ceramic surface in a preselected pattern.

5. The process of claim 1, wherein the alkali metal compound is present in the form of pellets.

6. The process of claim 1, wherein the solid shapes each have a mass in the anhydrous state between about 50 mg and about 500 mg.

7. The process of claim 6, wherein the solid shapes each have a mass in the anhydrous state between about 100 mg and 350 mg.

8. The process of claim 7, wherein the solid shapes are hemispheres and each has a mass in the anhydrous state between about 150 mg and 200 mg.

9. A process of claim 1, wherein the alkali metal compound is sodium hydroxide.

10. The process of claim 1, wherein the alkali metal composition and the ceramic substrate are heated to a temperature between about 450° C. and about 700° C.

11. The process of claim 1, wherein the ceramic substrate is alumina, and the alumina and the alkali metal composition are heated at a temperature between about 450° C. and about 650° C.

12. The process of claim 1, wherein the total weight of alkali metal composition shapes applied to the ceramic surface is at least about 0.1 mg of alkali metal composition per square millimeter of ceramic surface.

13. The process of claim 1, wherein the total weight of alkali metal composition shapes applied to the ceramic surface is between about 0.1 and about 0.4 mg of alkali metal composition per square millimeter of ceramic surface.

14. The process of claim 1, wherein the alkali metal composition and the substrate are heated for a time period between 5 and 20 minutes.

15. The process of claim 14, wherein the time period is between 7 and 10 minutes.

16. In a process for metallizing a surface of a ceramic substrate which includes adhesion promoting the surface with an alkali metal composition containing one or more alkali metal compounds and subsequently depositing metal on the adhesion promoted surface, the improvement which comprises:
 providing said alkali metal compound(s) in the form of a multiplicity of discrete solid pellets, each pellet having a mass between 150 mg and 200 mg;
 contacting the ceramic surface with a quantity of said alkali metal composition which when molten will spread across and uniformly wet the ceramic surface;
 heating the alkali metal composition and the substrate for a time period between 5 to 20 minutes at a temperature between about 450° C. and about 700° C. to melt the pellets in situ on the ceramic surface, the melting pellets spreading out and uniformly wetting the ceramic surface, said time and temperature being sufficient to adhesion promote the ceramic surface and render it receptive to subsequent adherent metal deposition,
 and in a later step plating an adherent metal layer on the treated ceramic surface or selected parts thereof.

17. A process for producing a printed circuit on a surface of a ceramic substrate comprising:
 (a) contacting the ceramic surface with an alkali metal composition comprised of an alkali metal compound in the form of a multiplicity of discrete solid shapes sized 25 mg to about 500 mg, each shape having a preselected mass, said shapes being present in a quantity which when molten will spread across and uniformly wet the ceramic surface;
 (b) heating the alkali metal composition and the substrate for a time period and at or above a temperature at which the alkali metal composition becomes molten in situ on the ceramic surface, spreading out and uniformly wetting the ceramic surface, and which is sufficient to adhesion promote the ceramic surface and render it receptive to subsequent adherent metal deposition
 (c) treating the ceramic surface to activate it for electroless metal deposition;
 (d) depositing metal onto the activated surface;
 (e) removing portions of the deposited metal to produce a metal printed circuit conductor pattern adhering to the surface of the ceramic substrate.

18. The process for producing a metallized conductor pattern on a surface of a ceramic substrate having a surface roughness less than about 0.7 micrometers, the process comprising:
 contacting the surface with an alkali metal composition comprised of one or more alkali metal compounds in the form of a multiplicity of discrete solid shapes sized 25 mg to about 500 mg, said shapes being present in a quantity which when molten will spread across and uniformly wet the ceramic surface;
 heating the alkali metal composition and the substrate for a time period and at or above a temperature at which the alkali metal composition becomes molten in situ on the ceramic surface, spreading out and uniformly wetting the ceramic surface, and which is sufficient to adhesion promote the ceramic surface and render it receptive to subsequent adherent metal deposition;
 rinsing said surface with an aqueous solution;
 neutralizing said ceramic surface with an acid;
 repeating said rinsing step;
 contacting said ceramic surface with an activator solution providing stannous tin ions and precious metal ions, to activate said surface for electroless metal deposition; and
 contacting said activated surface or selected parts thereof with a metal depositing solution for a time period sufficient to form a metal layer thereon.

19. The process of claim 2 wherein said acid halide solution constitutes part of said catalyst solution used for rendering said ceramic surface receptive to deposition of metal.

* * * * *